US011688803B2

(12) United States Patent
Tomita et al.

(10) Patent No.: US 11,688,803 B2
(45) Date of Patent: Jun. 27, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kouta Tomita, Nonoichi Ishikawa (JP); Hiroaki Katou, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/011,007

(22) Filed: Sep. 3, 2020

(65) Prior Publication Data
US 2021/0288176 A1 Sep. 16, 2021

(30) Foreign Application Priority Data
Mar. 16, 2020 (JP) .................................. 2020-045469

(51) Int. Cl.
*H01L 29/78* (2006.01)
*H01L 29/40* (2006.01)
(Continued)

(52) U.S. Cl.
CPC ........ *H01L 29/7813* (2013.01); *H01L 29/407* (2013.01); *H01L 29/408* (2013.01); *H01L 29/42368* (2013.01); *H01L 29/66734* (2013.01)

(58) Field of Classification Search
CPC ........... H01L 29/7813; H01L 29/66734; H01L 29/407; H01L 29/408; H01L 29/513; H01L 29/511
See application file for complete search history.

(56) References Cited

U.S. PATENT DOCUMENTS 1,158,627 A * 11/1915 Broughton ............ F16C 13/028
492/16
6,404,007 B1* 6/2002 Mo .................... H01L 21/28202
257/332

(Continued)

FOREIGN PATENT DOCUMENTS

| JP | 2016-72482 A | 5/2016 |
| JP | 2017-199806 A | 11/2017 |
| WO | 2014-10006 A1 | 1/2014 |

*Primary Examiner* — Vincent Wall
(74) *Attorney, Agent, or Firm* — Allen & Overy LLP

(57) ABSTRACT

A semiconductor device includes first and second electrodes; a semiconductor part between the first and second electrodes; a control electrode and a third electrode in a trench between the semiconductor part and the second electrode. The device further includes a first insulating part insulating the control electrode from the semiconductor part; a second insulating part insulating the third electrode from the semiconductor part; and a third insulating part insulating the third electrode from the control electrode. The second insulating part includes first and second insulating films and a portion of a third insulating film. The first insulating film is provided between the semiconductor part and the third electrode. The second insulating film is provided between the first insulating film and the third electrode. The third insulating film includes the portion between the first insulating film and the second insulating film, and another portion inside the third insulating part.

13 Claims, 11 Drawing Sheets

(51) Int. Cl.
  *H01L 29/66* (2006.01)
  *H01L 29/423* (2006.01)

(56) References Cited

U.S. PATENT DOCUMENTS

| | | | | |
|---|---|---|---|---|
| 8,362,548 | B2* | 1/2013 | Burke | H01L 29/41741 |
| | | | | 257/330 |
| 8,872,257 | B1* | 10/2014 | Matsuoka | H01L 29/7397 |
| | | | | 257/328 |
| 9,041,098 | B2* | 5/2015 | Ichinoseki | H01L 29/4238 |
| | | | | 257/330 |
| 9,716,009 | B2 | 7/2017 | Kobayashi et al. | |
| 9,799,742 | B1* | 10/2017 | Tsai | H01L 29/66666 |
| 9,917,183 | B2* | 3/2018 | Arai | H01L 29/66734 |
| 10,304,933 | B1* | 5/2019 | Woo | H01L 21/28035 |
| 10,325,988 | B2* | 6/2019 | Georgescu | H01L 29/404 |
| 11,158,627 | B2* | 10/2021 | Feil | H01L 29/4236 |
| 11,158,735 | B2* | 10/2021 | Siemieniec | H01L 29/1095 |
| 2002/0024092 | A1* | 2/2002 | Palm | H01L 29/66833 |
| | | | | 257/330 |
| 2004/0089910 | A1* | 5/2004 | Hirler | H01L 29/407 |
| | | | | 257/500 |
| 2007/0138547 | A1* | 6/2007 | Nakamura | H01L 29/66734 |
| | | | | 257/331 |
| 2009/0053869 | A1* | 2/2009 | Hirler | H01L 29/0878 |
| | | | | 438/270 |
| 2009/0108342 | A1* | 4/2009 | Wang | H01L 29/456 |
| | | | | 257/330 |
| 2010/0065903 | A1* | 3/2010 | Parthasarathy | H01L 29/7802 |
| | | | | 257/329 |
| 2011/0165755 | A1* | 7/2011 | Zundel | H01L 21/743 |
| | | | | 438/386 |
| 2011/0215399 | A1* | 9/2011 | Matsuura | H01L 29/78 |
| | | | | 257/331 |
| 2012/0061723 | A1* | 3/2012 | Ishii | H01L 29/407 |
| | | | | 257/E29.198 |
| 2013/0069150 | A1* | 3/2013 | Matsuoka | H01L 29/407 |
| | | | | 257/330 |
| 2014/0077278 | A1* | 3/2014 | Nozu | H01L 29/66477 |
| | | | | 257/288 |
| 2015/0179744 | A1 | 6/2015 | Mine et al. | |
| 2016/0049486 | A1* | 2/2016 | Blank | H01L 29/66666 |
| | | | | 257/330 |
| 2017/0213906 | A1* | 7/2017 | Li | H01L 29/4236 |
| 2017/0317068 | A1 | 11/2017 | Kaneda | |
| 2020/0052110 | A1* | 2/2020 | Feil | H01L 29/7813 |

* cited by examiner

SEMICONDUCTOR DEVICE

CROSS-REFERENCE TO RELATED APPLICATIONS

This application is based upon and claims the benefit of priority from Japanese Patent Application No. 2020-045469, filed on Mar. 16, 2020; the entire contents of which are incorporated herein by reference.

FIELD

Embodiments relate to a semiconductor device.

BACKGROUND

It is desirable for a power control semiconductor device to have the characteristics of a high breakdown voltage and a low ON-resistance. For example, in a trench-gate MOSFET, a gate electrode and a field plate are disposed inside a gate trench to achieve the characteristics of the high breakdown voltage and the low ON-resistance. In such a trench gate structure, a thick insulating film is provided between the field plate and the semiconductor layer. Therefore, the insulating film is formed inside the gate trench by using, for example, CVD (Chemical Vapor Deposition) for reducing the internal stress thereof. However, such an insulating film may include an impurity that affects the device characteristics.

DETAILED DESCRIPTION

Figure 1A:
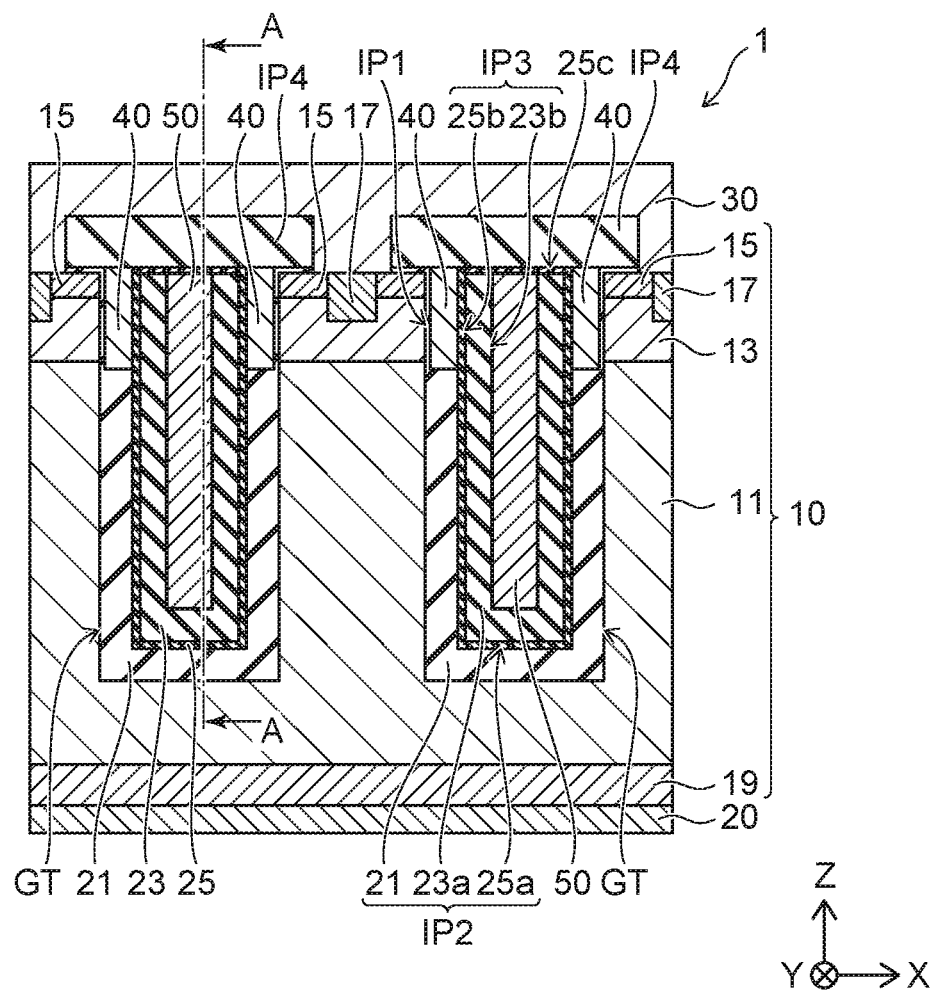
FIGS. 1A and 1B are schematic cross-sectional views showing a semiconductor device according to an embodiment.

According to one embodiment, a semiconductor device includes a semiconductor part; a first electrode provided on a back surface of the semiconductor part; a second electrode provided on a front surface of the semiconductor part; a control electrode provided between the semiconductor part and the second electrode, the semiconductor part having a trench at the front surface side, the control electrode being provided in the trench; a third electrode provided inside the trench, the third electrode being provided away from the control electrode, a distance between the third electrode and the first electrode being smaller than a distance between the control electrode and the first electrode. The device further includes a first insulating part electrically insulating the control electrode from the semiconductor part; a second insulating part electrically insulating the third electrode from the semiconductor part; and a third insulating part electrically insulating the third electrode from the control electrode. The semiconductor part includes a first semiconductor layer of a first conductivity type, a second semiconductor layer of a second conductivity type, and a third semiconductor layer of the first conductivity type. The first semiconductor layer extends between the first and second electrodes. The second semiconductor layer is provided between the first semiconductor layer and the second electrode. The third semiconductor layer is selectively provided between the second semiconductor layer and the second electrode. The first insulating part is provided between the control electrode and the second semiconductor layer. The second insulating part is provided between the third electrode and the first semiconductor layer. The second insulating part includes a first insulating film, a second insulating film and a first portion of a third insulating film. The first insulating film is provided between the semiconductor part and the third electrode. The second insulating film is provided between the first insulating film and the third electrode. The third insulating film includes the first portion provided between the first insulating film and the second insulating film, and a second portion extending inside the third insulating part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
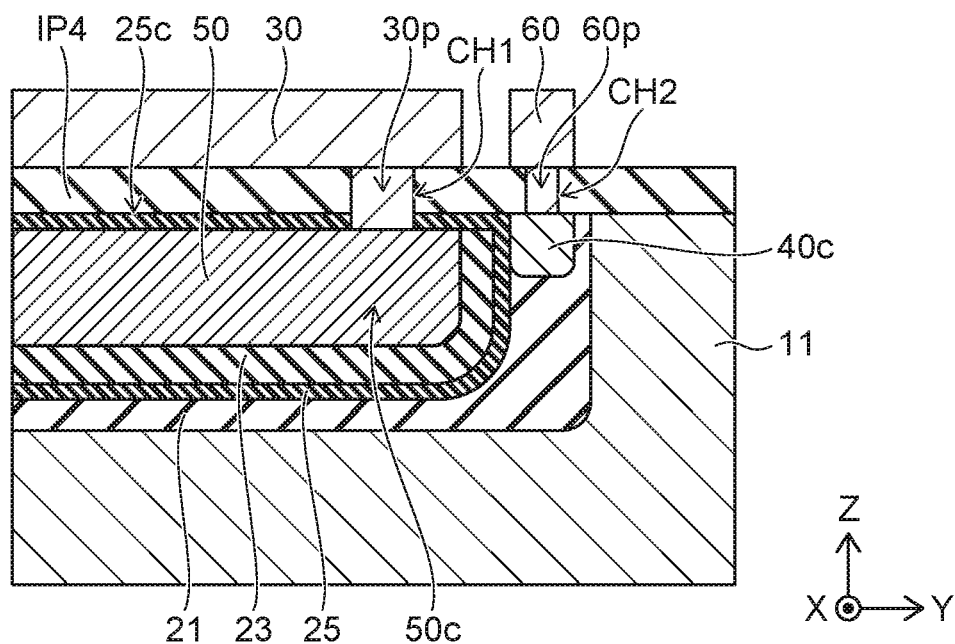

FIGS. 1A and 1B are schematic cross-sectional views showing a semiconductor device 1 according to an embodiment. FIG. 1B is a cross-sectional view along line A-A shown in FIG. 1A.

The semiconductor device 1 is a trench-gate MOSFET. The semiconductor device 1 includes a semiconductor part 10, a first electrode (hereinbelow, a drain electrode 20), a second electrode (hereinbelow, a source electrode 30), a control electrode (hereinbelow, a gate electrode 40), and a third electrode (hereinbelow, a field plate 50). The semiconductor part 10 is, for example, silicon.

The drain electrode 20 is provided on the back surface of the semiconductor part 10. The source electrode 30 is provided on the front surface of the semiconductor part 10. The gate electrode 40 is provided between the semiconductor part 10 and the source electrode 30. The gate electrode 40 is provided in a gate trench GT of the semiconductor part 10.

The field plate 50 (hereinbelow, the FP 50) is provided in the gate trench GT with the gate electrode 40. The FP 50 is provided away from the gate electrode 40 inside the gate trench GT. For example, the FP 50 is provided at a position more proximate to the drain electrode 20 than the gate electrode 40. That is, a distance between the drain electrode 20 and the FP 50 is smaller than the distance between the drain electrode 20 and the gate electrode 40.

The semiconductor part 10 includes an n-type drift layer 11, a p-type diffusion layer 13, an n-type source layer 15, a p-type contact layer 17, and an n-type drain layer 19.

For example, the n-type drift layer 11 extends in the X-direction and the Y-direction between the drain electrode 20 and the source electrode 30. The n-type drift layer 11 spreads over the entire semiconductor part 10. The n-type drift layer 11 includes an n-type impurity with a low concentration so that the n-type drift layer 11 is depleted in the OFF switching operation and provides a prescribed breakdown voltage.

The p-type diffusion layer 13 is provided between the n-type drift layer 11 and the source electrode 30.

The n-type source layer 15 is selectively provided between the p-type diffusion layer 13 and the source electrode 30. The n-type source layer 15 includes the n-type impurity with a higher concentration than a concentration of the n-type impurity in the n-type drift layer 11.

The p-type contact layer 17 is selectively provided between the p-type diffusion layer 13 and the source electrode 30. The p-type contact layer 17 and the n-type source layer 15 are arranged along the front surface of the semiconductor part 10 between the p-type diffusion layer 13 and the source electrode 30. The p-type contact layer 17 includes the p-type impurity with a higher concentration than a concentration of the p-type impurity in the p-type diffusion layer 13.

The n-type drain layer 19 is provided between the n-type drift layer 11 and the drain electrode 20. The n-type drain layer 19 includes the n-type impurity with a higher concentration than the concentration of the n-type impurity in the n-type drift layer 11.

For example, the drain electrode 20 contacts the n-type drift layer 11 and is electrically connected to the n-type drift layer 11. For example, the source electrode 30 contacts the n-type source layer 15 and the p-type contact layer 17. The source electrode 30 is electrically connected to the n-type source layer 15 and the p-type contact layer 17. Also, the source electrode 30 is electrically connected to the p-type diffusion layer 13 via the p-type contact layer 17.

As shown in FIG. 1A, the semiconductor device 1 further includes a first insulating part IP1, a second insulating part IP2, a third insulating part IP3, and a fourth insulating part IP4. The first to third insulating parts IP1 to IP3 are provided inside the gate trench GT. The fourth insulating part IP4 is provided between the source electrode 30 and the gate electrode 40.

The first insulating part IP1 electrically insulates the gate electrode 40 from the semiconductor part 10. For example, the first insulating part IP1 is positioned between the p-type diffusion layer 13 and the gate electrode 40 and serves as a gate insulating film. The first insulating part IP1 is, for example, a silicon oxide film.

The second insulating part IP2 electrically insulates the FP 50 from the semiconductor part 10. The second insulating part IP2 is provided between the n-type drift layer 11 and the FP 50. For example, the second insulating part IP2 has a stacked structure including an insulating film 21, a portion of an insulating film 23, and a portion of an insulating film 25.

The insulating film 21 and the insulating film 23 are, for example, silicon oxide films. The insulating film 23 includes a first portion 23a and a second portion 23b. The insulating film 25 is, for example, a silicon nitride film. The insulating film 25 includes a first portion 25a, a second portion 25b, and a third portion 25c.

The second insulating part IP2 includes the insulating film 21, the first portion 23a of the insulating film 23, and the first portion 25a of the insulating film 25. The insulating film 21 is positioned between the n-type drift layer 11 and the FP 50.

The first portion 23a of the insulating film 23 is positioned between the insulating film 21 and the FP 50. The first portion 25a of the insulating film 25 is positioned between the insulating film 21 and the first portion 23a of the insulating film 23.

The third insulating part IP3 is provided between the gate electrode 40 and the FP 50. For example, the insulating film 23 and the insulating film 25 extend into the third insulating part IP3. In other words, the third insulating part IP3 includes the second portion 23b of the insulating film 23 and the second portion 25b of the insulating film 25. The second portion 23b of the insulating film 23 is provided between the FP 50 and the second portion 25b of the insulating film 25. The second portion 25b of the insulating film 25 is provided between the gate electrode 40 and the second portion 23b of the insulating film 23.

The fourth insulating part IP4 electrically insulates the gate electrode 40 from the source electrode 30. The fourth insulating part IP4 includes, for example, silicon oxide and so-called BPSG, i.e., a silicate including boron (B) and phosphorus (P).

In the example, the FP 50 extends to the vicinity of the fourth insulating part IP4. The third portion 25c of the insulating film 25 is provided between the fourth insulating part IP4 and the FP 50 and between the fourth insulating part IP4 and the second portion 23b of the insulating film 23. The insulating film 25 is provided to surround the insulating film 23 and the FP 50.

As shown in FIG. 1B, for example, the FP 50 is electrically connected to the source electrode 30. The FP 50 extends in a direction (e.g., the Y-direction) along the front surface of the semiconductor part 10 and includes a connection portion 50c provided at the end in the Y-direction. The source electrode 30 includes a contact portion 30p extending through a contact hole CH1 that is provided in the fourth insulating part IP4 and the third portion 25c of the insulating film 25. The contact portion 30p contacts the connection portion 50c and electrically connects the FP 50 to the source electrode 30.

The gate electrode 40 extends in the Y-direction and includes a gate connection portion 40c provided at the end in the Y-direction. The gate electrodes 40 provided at the two sides of the FP 50 are linked by the gate connection portion 40c at the end in the Y-direction. The gate connection portion 40c is connected to a gate interconnect 60 provided on the fourth insulating part IP4. The gate interconnect 60 includes a contact portion 60p extending through a contact hole CH2 that is provided in the fourth insulating part IP4. The contact portion 60p electrically connects the gate electrode 40 to the gate interconnect 60.

The connection structures of the gate electrode 40 and the FP 50 recited above are examples and are not limited thereto.

A method for manufacturing the semiconductor device 1 according to the embodiment will now be described with reference to FIGS. 2A to 9B. FIGS. 2A to 9B are schematic cross-sectional views showing manufacturing processes of the semiconductor device 1 according to the embodiment.

Figure 2A:
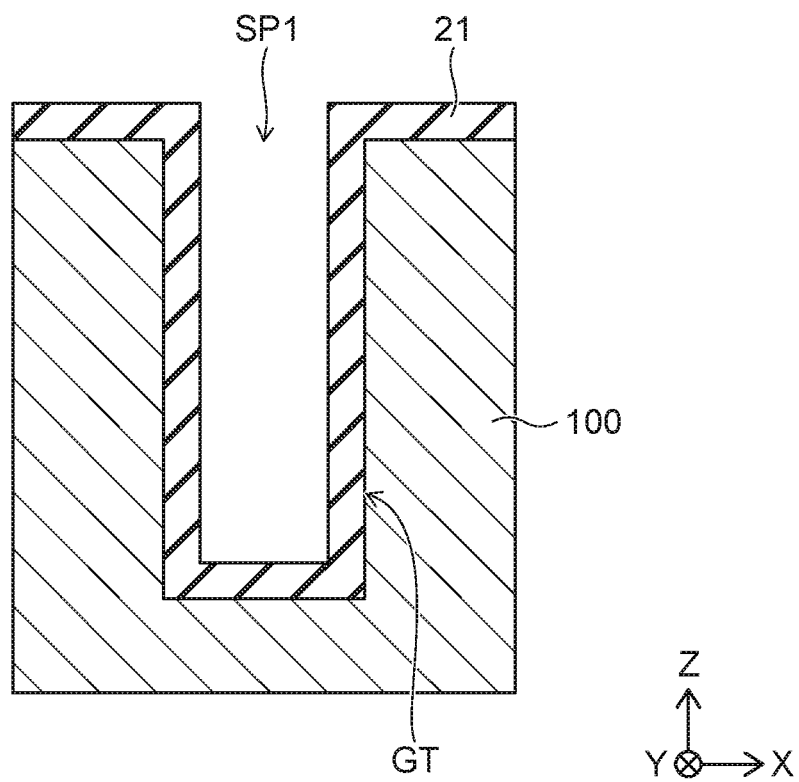
FIGS. 2A to 9B are schematic cross-sectional views showing manufacturing processes of the semiconductor device according to the embodiment.

As shown in FIG. 2A, the insulating film 21 is formed after forming the gate trench GT in a semiconductor wafer 100. The semiconductor wafer 100 is, for example, an n-type silicon wafer. The semiconductor wafer 100 includes an n-type impurity with the same concentration as the concentration of the n-type impurity in the n-type drift layer 11. The insulating film 21 covers the inner surface of the gate trench GT. The insulating film 21 is formed so that a space SP1 remains inside the gate trench GT. For example, the insulating film 21 is formed by thermal oxidation of the semiconductor wafer 100. The insulating film 21 is, for example, a silicon oxide film.

Figure 2B:
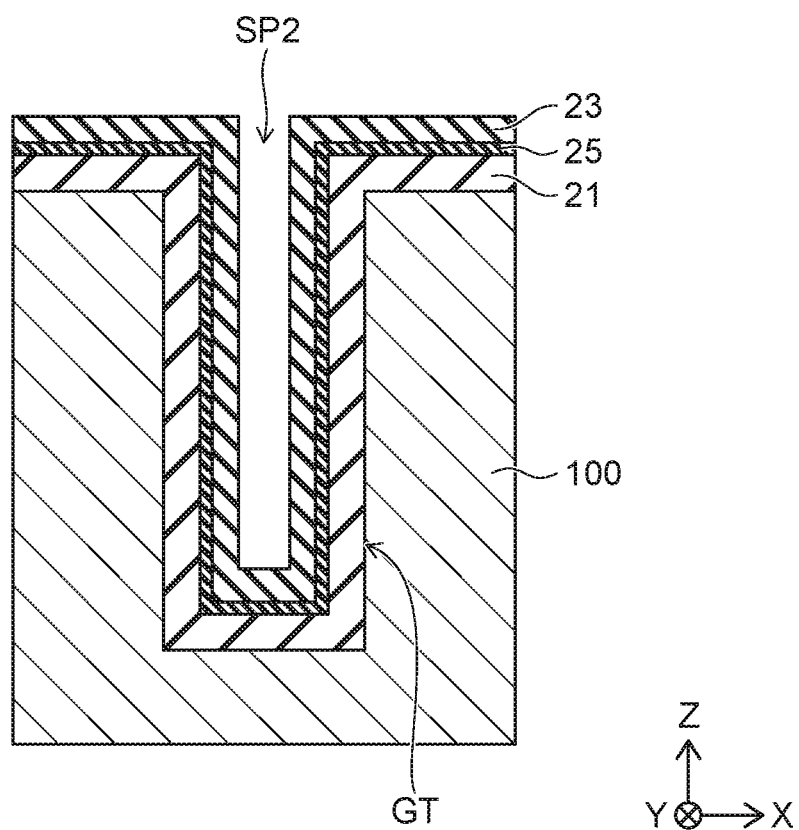

As shown in FIG. 2B, the insulating film 25 is formed on the insulating film 21; subsequently, the insulating film 23 is stacked on the insulating film 25. The insulating film 23 and the insulating film 25 are stacked inside the gate trench GT so that a space SP2 remains therein.

The insulating film 23 and the insulating film 25 are formed, for example, using CVD. The insulating film 23 is, for example, a silicon oxide film, and the insulating film 25 is, for example, a silicon nitride film. The insulating film 25 is deposited, for example, at a higher temperature than a temperature at which the insulating film 23 is deposited. For example, the insulating film 25 is formed to have a thinner film thickness than the film thickness of the insulating film 23. In other words, the stacked structure of the insulating film 21, the insulating film 23 and the insulating film 25 includes the internal stress suppressed by the insulating film 23 formed at a lower temperature than the temperature at which the insulating film 21 and the insulating film 25 are deposited.

Figure 3A:
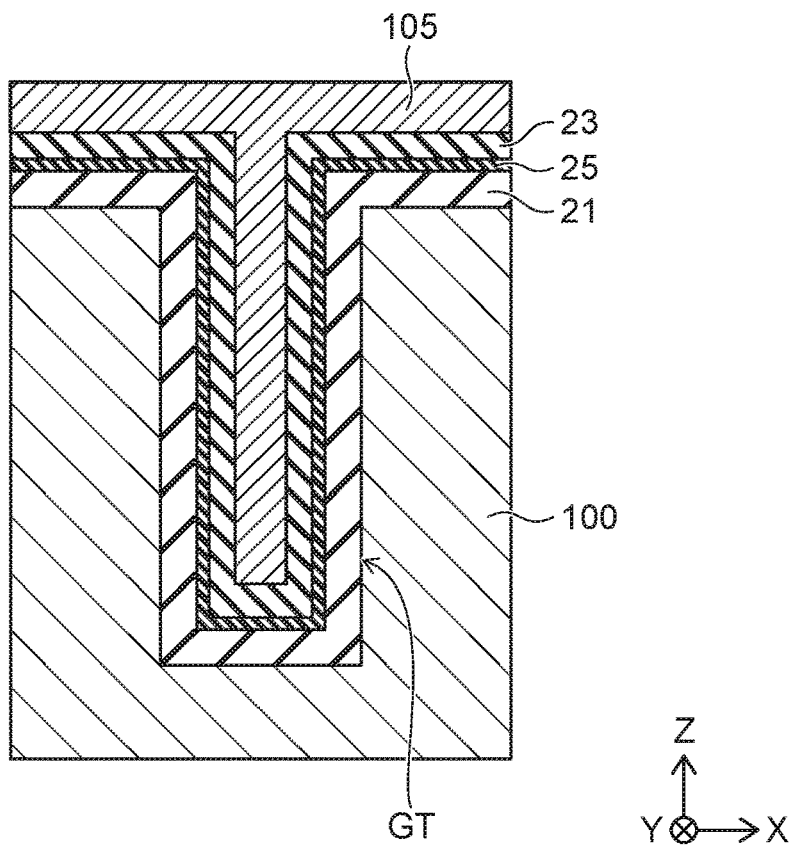

As shown in FIG. 3A, a conductive film 105 is formed on the insulating film 23. The conductive film 105 is formed to fill the space SP2 inside the gate trench GT. The conductive film 105 is, for example, a polysilicon film. The conductive film 105 is deposited, for example, using CVD.

Figure 3B:
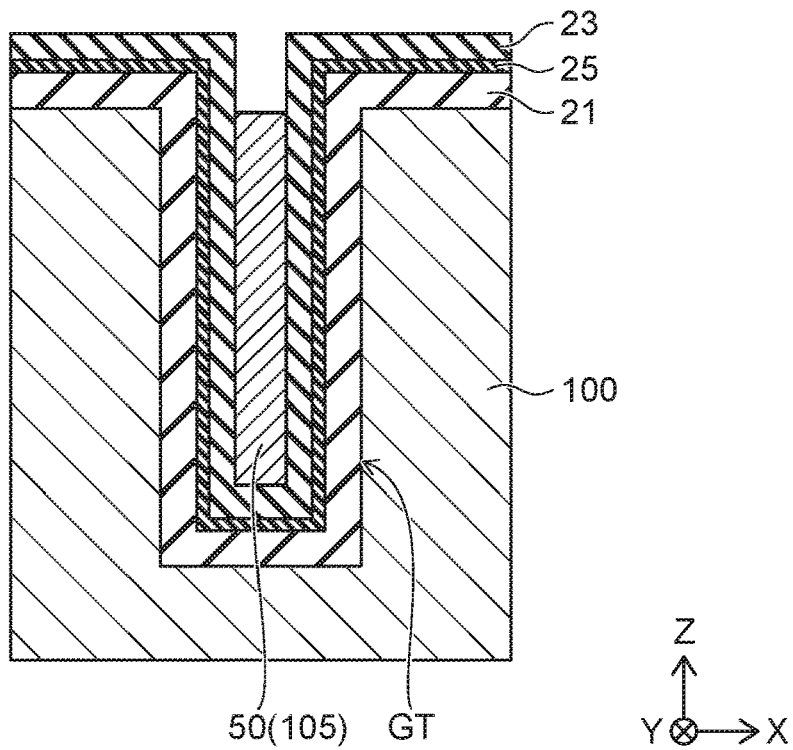

As shown in FIG. 3B, the FP 50 is formed inside the gate trench GT by selectively removing the conductive film 105. For example, the conductive film 105 is removed using dry etching so that the portion provided in the gate trench GT remains.

Figure 4A:
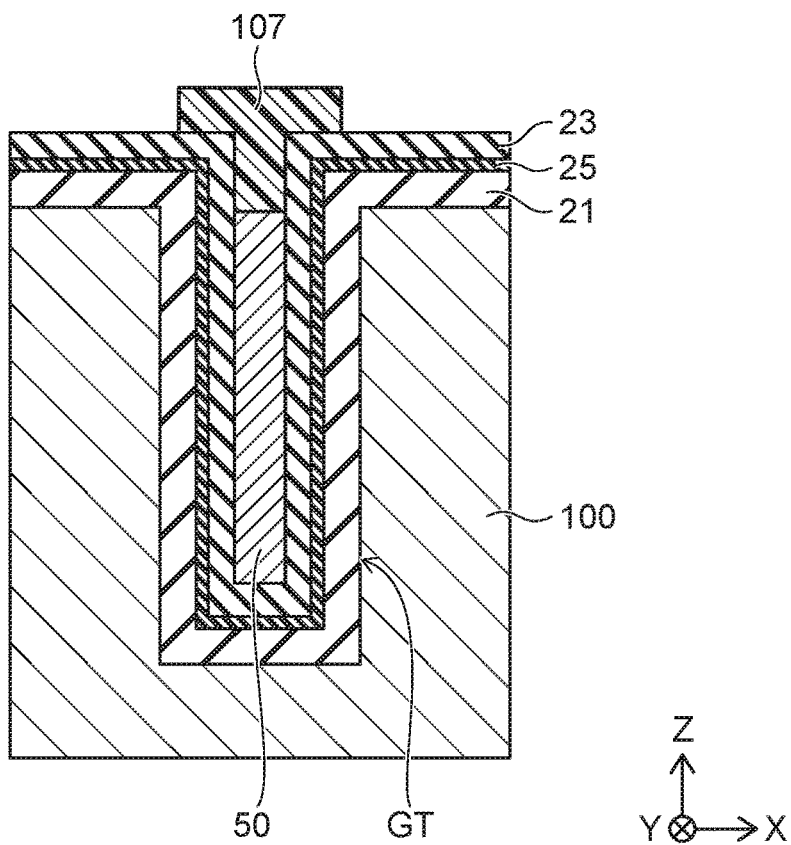

As shown in FIG. 4A, an etching mask 107 is formed on the FP 50. The etching mask 107 is, for example, a photoresist mask formed to cover the opening of the gate trench GT.

Figure 4B:
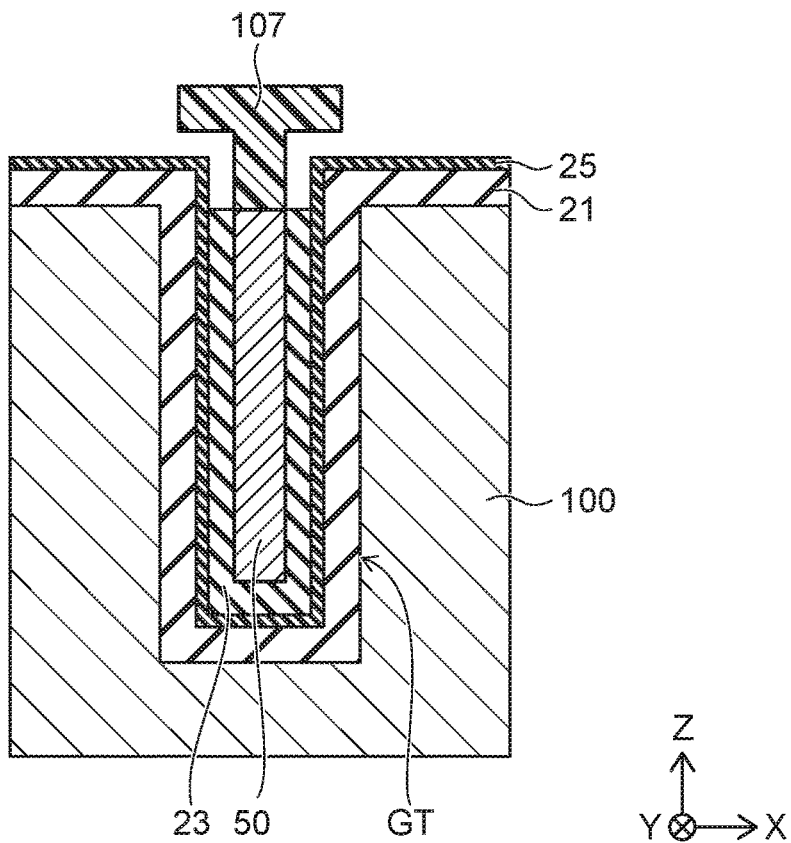

As shown in FIG. 4B, the insulating film 23 is selectively removed using the etching mask 107. The insulating film 23 is selectively removed so that a portion provided in the gate trench GT remains. The insulating film 23 is selectively removed using, for example, wet etching. The insulating film 23 is removed so that the upper end of the portion remaining inside the gate trench GT is positioned, for example, at the same level as the upper end of the FP 50 in the Z-direction.

Figure 5A:
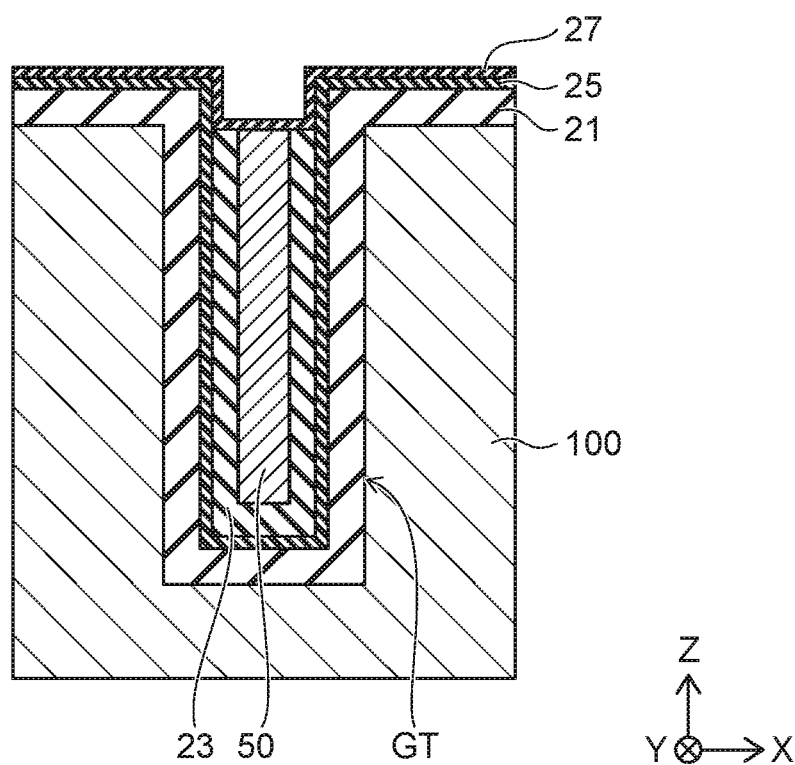

As shown in FIG. 5A, an insulating film 27 is formed on the insulating film 25 after the etching mask 107 is removed. The insulating film 27 is formed to cover the FP 50 and the insulating film 23 which are provided inside the gate trench GT. The insulating film 27 is, for example, a silicon nitride film. The insulating film 27 is deposited, for example, using CVD. In the description hereinbelow, the insulating film 25 and the insulating film 27 are differentiated for convenience, but the insulating films 25 and 27 may be joined to be an insulating film having a continuous body.

Figure 5B:
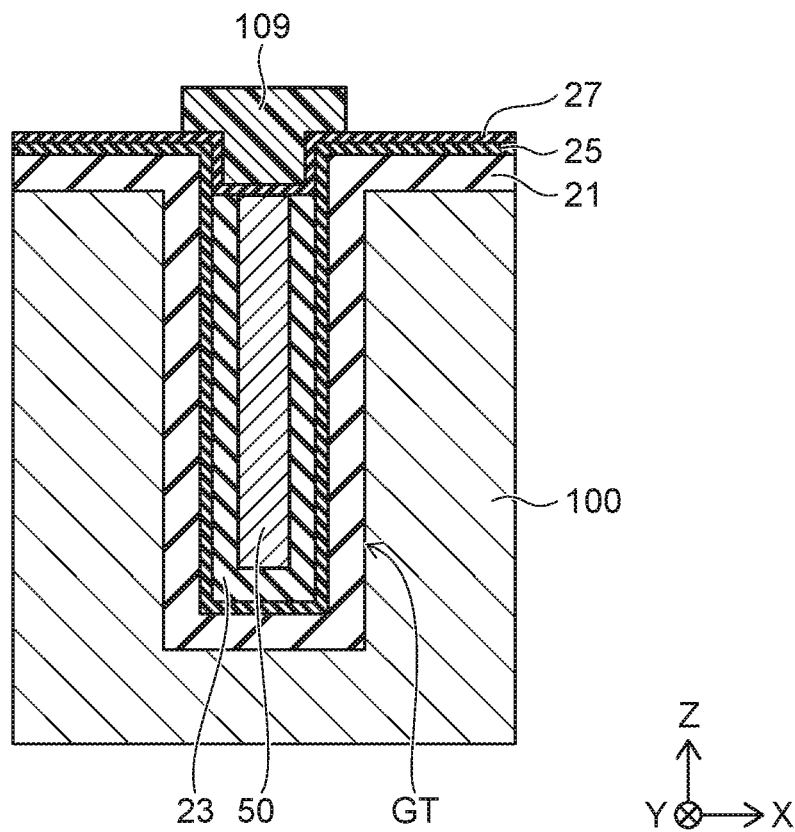

As shown in FIG. 5B, an etching mask 109 is formed above the gate trench GT. The etching mask 109 is, for example, a photoresist mask formed to cover the opening of the gate trench GT.

Figure 6A:
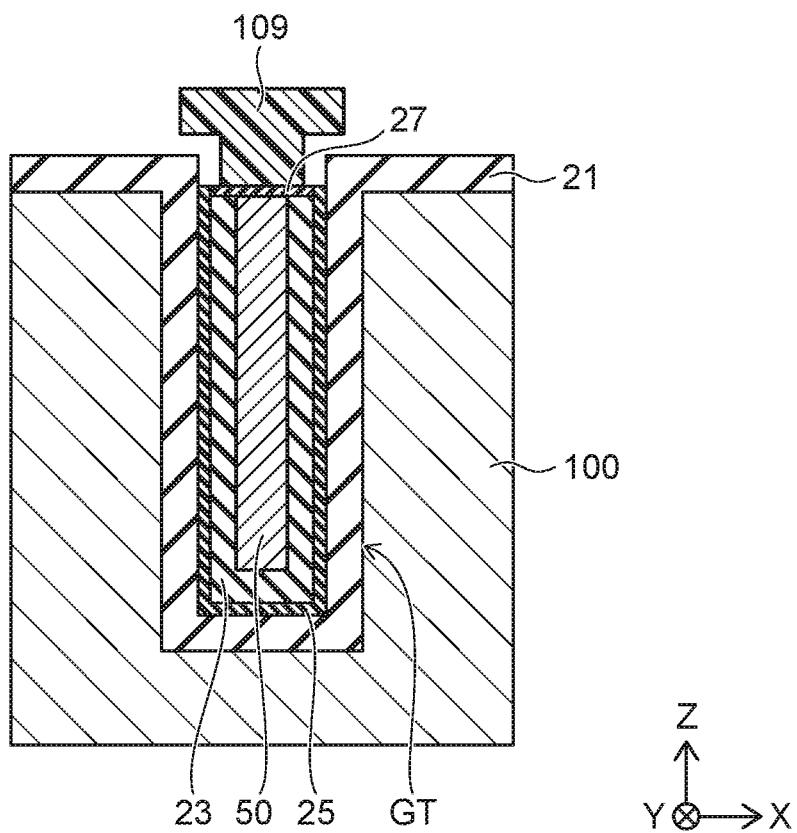

As shown in FIG. 6A, the insulating film 25 and the insulating film 27 are selectively removed using the etching mask 109. The insulating film 27 is removed so that the remaining portion of the insulating film 27 covers the insulating film 23 and the FP 50. For example, the insulating film 25 is removed so that the upper end of the portion remaining inside the gate trench GT is positioned at the same level in the Z-direction as the upper surface of the portion of the insulating film 27 that covers the insulating film 23 and the FP 50. The insulating film 25 and the insulating film 27 are removed using, for example, wet etching.

Figure 6B:
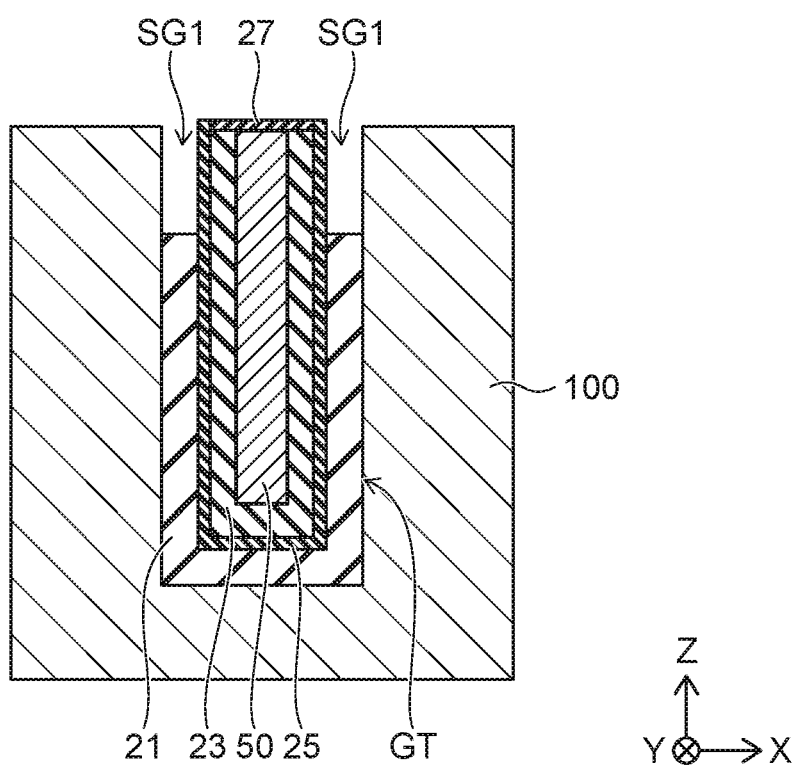

As shown in FIG. 6B, after the etching mask 109 is removed, the insulating film 21 is selectively removed to form a space SG1 in the upper portion of the gate trench GT. The space SG1 is formed between the insulating film 25 and the inner wall of the gate trench GT. The insulating film 21 is removed using, for example, wet etching.

Figure 7A:
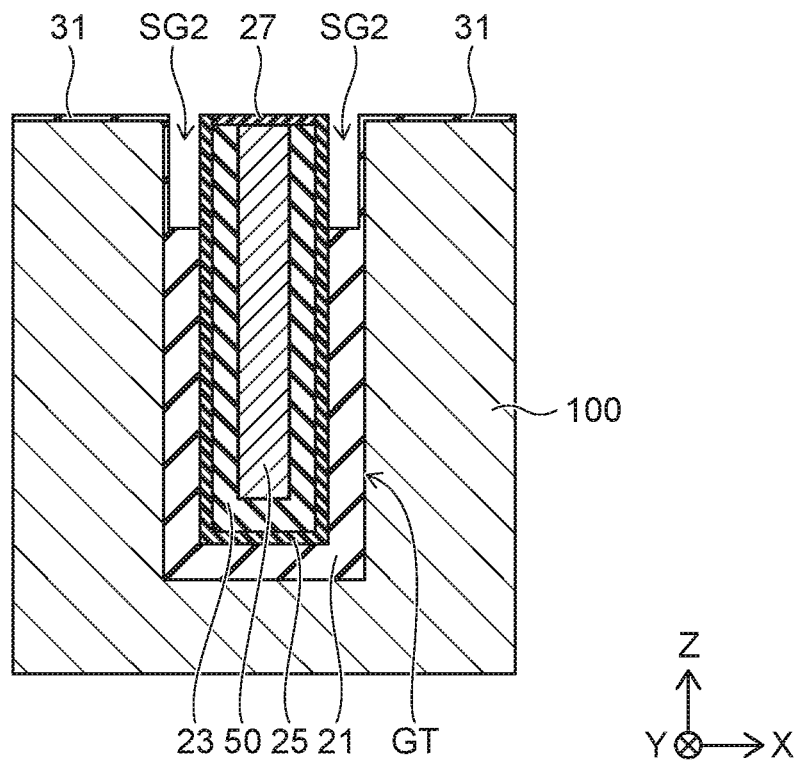

As shown in FIG. 7A, an insulating film 31 is formed on the semiconductor wafer 100. The exposed portion of the semiconductor wafer 100 is thermally oxidized to form the insulating film 31. The insulating film 31 is formed to cover the inner wall of the gate trench GT and the front surface of the semiconductor wafer 100. The insulating film 31 is formed so that a space SG2 remains in the upper portion of the gate trench GT. The insulating film 31 is, for example, a silicon oxide film.

Figure 7B:
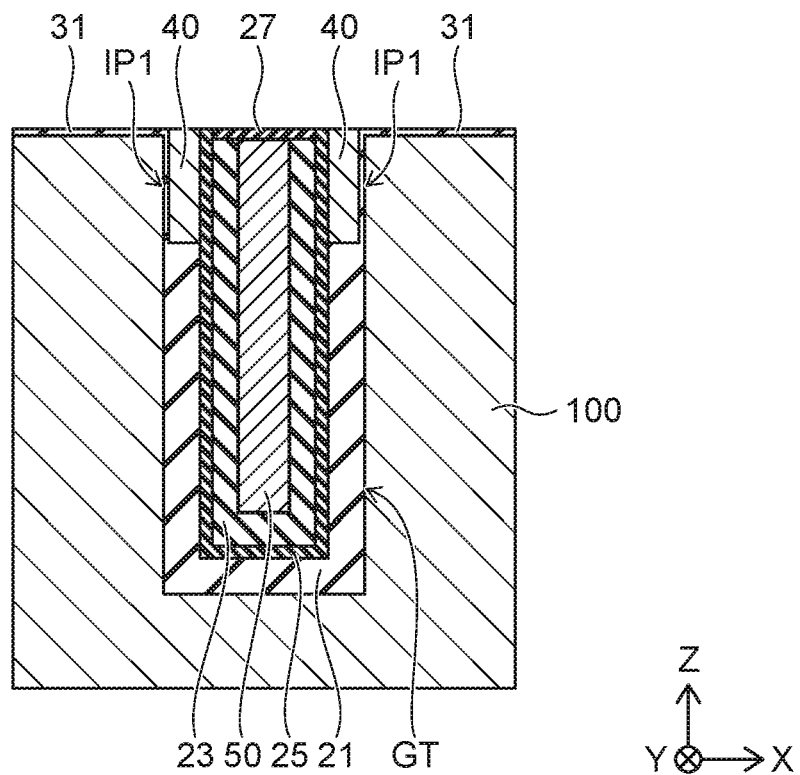

As shown in FIG. 7B, the gate electrode 40 is formed inside the space SG2. For example, conductive polysilicon is deposited to fill the space SG2 by using CVD; subsequently, the polysilicon is selectively removed so that the portion filling the space SG2 remains. The polysilicon is removed using, for example, dry etching. A portion of the insulating film 31 serves as the first insulating part IP1, which is provided between the gate electrode 40 and the semiconductor wafer 100.

Figure 8A:
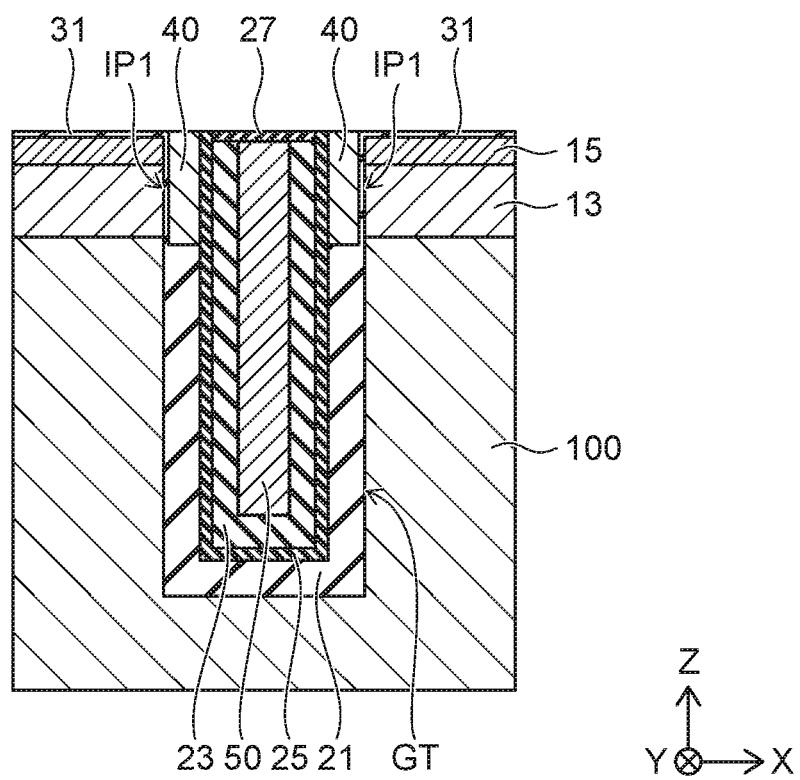

As shown in FIG. 8A, the p-type diffusion layer 13 and the n-type source layer 15 are formed at the front surface side of the semiconductor wafer 100.

The p-type diffusion layer 13 is formed by an ion-implantation of a p-type impurity, e.g., boron (B). The p-type impurity is implanted into the semiconductor wafer 100, which is activated and diffused by heat treatment. The p-type diffusion layer 13 is formed so that the lower surface of the p-type diffusion layer 13 is positioned at the same level in the Z-direction as the lower end of the gate electrode 40 or higher than the lower end of the gate electrode 40 in the Z-direction. In other words, the p-type diffusion layer 13 faces the gate electrode 40 via the insulating film 31 (i.e., the first insulating part IP1).

After the p-type diffusion layer 13 is formed, the n-type source layer 15 is formed by an ion-implantation of an n-type impurity, e.g., phosphorus (P). The n-type impurity is activated by heat treatment. The n-type source layer 15 is formed so that the lower surface of the n-type source layer 15 is positioned at a higher level in the Z-direction than a level of the lower surface of the p-type diffusion layer 13. The n-type source layer 15 is formed to contact the insulating film 31.

Figure 8B:
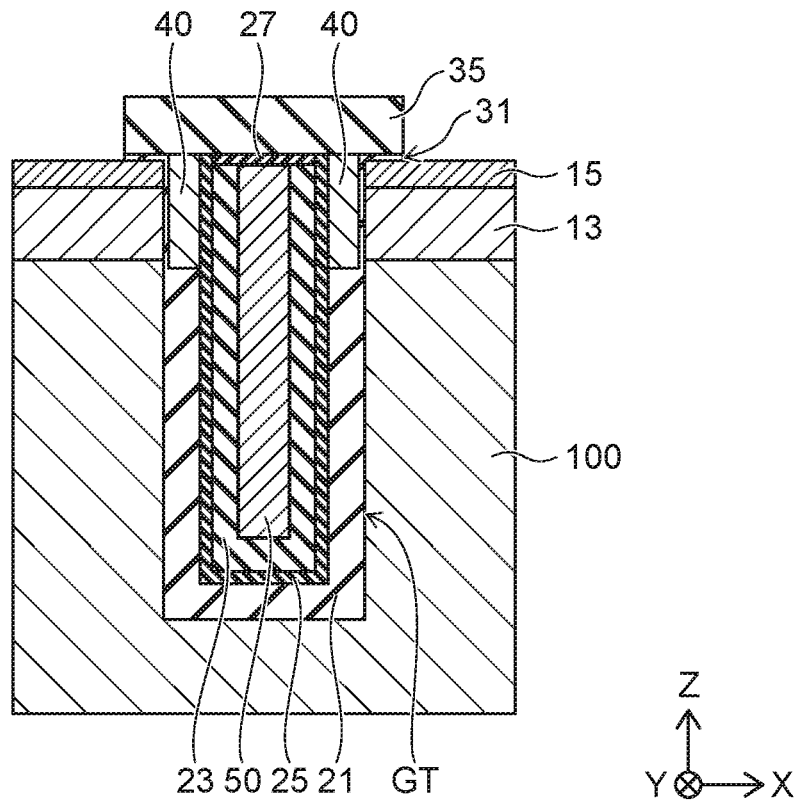

As shown in FIG. 8B, an insulating film 35 is formed above the gate trench GT. The insulating film 35 is formed to cover the gate electrode 40 and the FP 50. The insulating film 35 covers the FP 50 with the insulating film 27 interposed. The insulating film 35 may have a stacked structure including, for example, a silicon oxide film and a BPSG The insulating film 35 is formed on the front surface of the semiconductor wafer by using, for example, CVD. Subsequently, the insulating film 35 is selectively removed so that a portion covering the gate trench GT remains. A portion of the insulating film 31 also is selectively removed with the insulating film 35 to expose the n-type source layer 15. The insulating film 31 and the insulating film 35 are selectively removed by, for example, wet etching using an etching mask (not-illustrated).

Figure 9A:
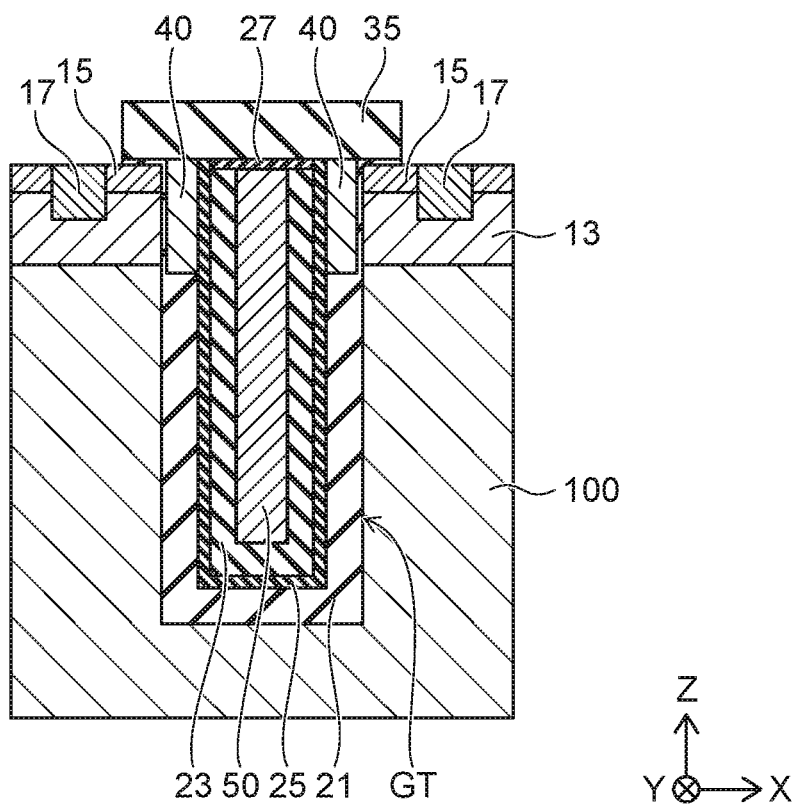

As shown in FIG. 9A, the p-type contact layer 17 is formed at the front surface side of the semiconductor wafer 100. The p-type contact layer 17 is selectively provided in a region where the n-type source layer 15 is exposed. The p-type contact layer 17 is formed by a selective ion-implantation of a p-type impurity, e.g., boron (B). The p-type impurity is activated by heat treatment. The p-type contact layer 17 extends through the n-type source layer 15 and reaches the p-type diffusion layer 13.

Figure 9B:
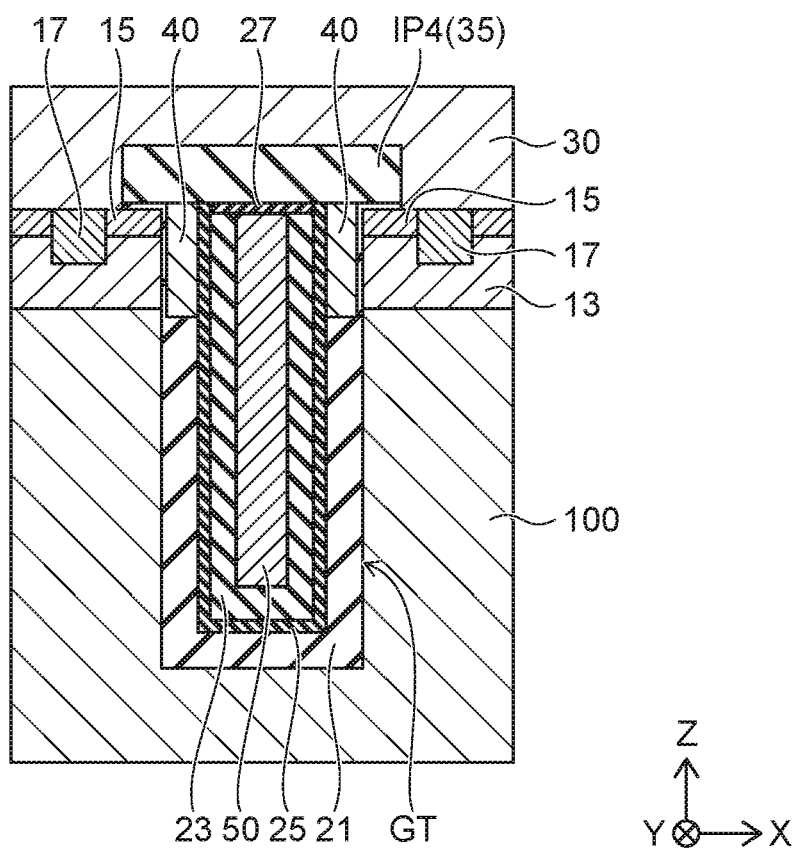

As shown in FIG. 9B, the source electrode 30 is formed selectively on the front surface of the semiconductor wafer 100. The source electrode 30 covers the fourth insulating part IP4 (the insulating film 35) and contacts the n-type source layer 15 and the p-type contact layer 17. The source electrode 30 is, for example, a metal layer including aluminum.

Then, the semiconductor wafer 100 is thinned to a prescribed thickness by etching or polishing at the back surface side. Subsequently, the n-type drain layer 19 (referring to FIG. 1A) is formed at the back surface side of the semiconductor wafer 100 by an ion-implantation of an n-type impurity, e.g., phosphorus (P) that is activated by heat treatment. The n-type drain layer 19 includes an n-type impurity with a higher concentration than the concentration of the n-type impurity in the n-type drift layer 11. The n-type drift layer 11 is formed between the p-type diffusion layer 13 and the n-type drain layer 19.

The drain electrode 20 (referring to FIG. 1A) is formed on the back surface of the semiconductor wafer 100, and the semiconductor device 1 is completed. The drain electrode 20 is, for example, a metal film including aluminum or gold.

In the manufacturing processes recited above, the insulating film 23 is formed at a lower temperature than the temperature at which the insulating film 21 and the insulating film 25 are formed. Thus, the insulating film 23 may include mobile impurity ions such as sodium (Na), potassium (K), etc. The device characteristics of the semiconductor device 1 may be affected when such an impurity moves through the insulating film and reaches the vicinity of the interface between the semiconductor and the insulating film. For example, the switching characteristics of the semiconductor device 1 degrade when such an impurity moves into the first insulating part IP1 between the semiconductor part 10 and the gate electrode 40.

In the embodiment, the impurity is prevented from moving out of the insulating film 23 by the insulating film 25 that is a silicon nitride film. That is, it is possible to prevent the movement of the impurity from the insulating film 23 to the first insulating part IP1, and stabilize the switching characteristics of the semiconductor device 1. The insulating film 25 is not limited to a silicon nitride film, and it is sufficient for the insulating film 25 to include a material forming a barrier to mobile impurity ions such as sodium (Na), potassium (K), etc.

The insulating film 35 that serves as the fourth insulating part IP4 also is formed using CVD. When the fourth insulating part IP4 includes an impurity, it is also possible to prevent the movement of the impurity from the fourth insulating part IP4 to the first insulating part IP1. For example, the BPSG included in the insulating film 35 takes the impurity therein and suppresses the movement of the impurity.

In the embodiment, it is also possible to increase the insulation breakdown voltage between the n-type drift layer 11 and the FP 50 by interposing a silicon nitride film between the insulating film 21 and the insulating film 23, because the silicon nitride film is more insulative than a silicon oxide film.

Figure 10:
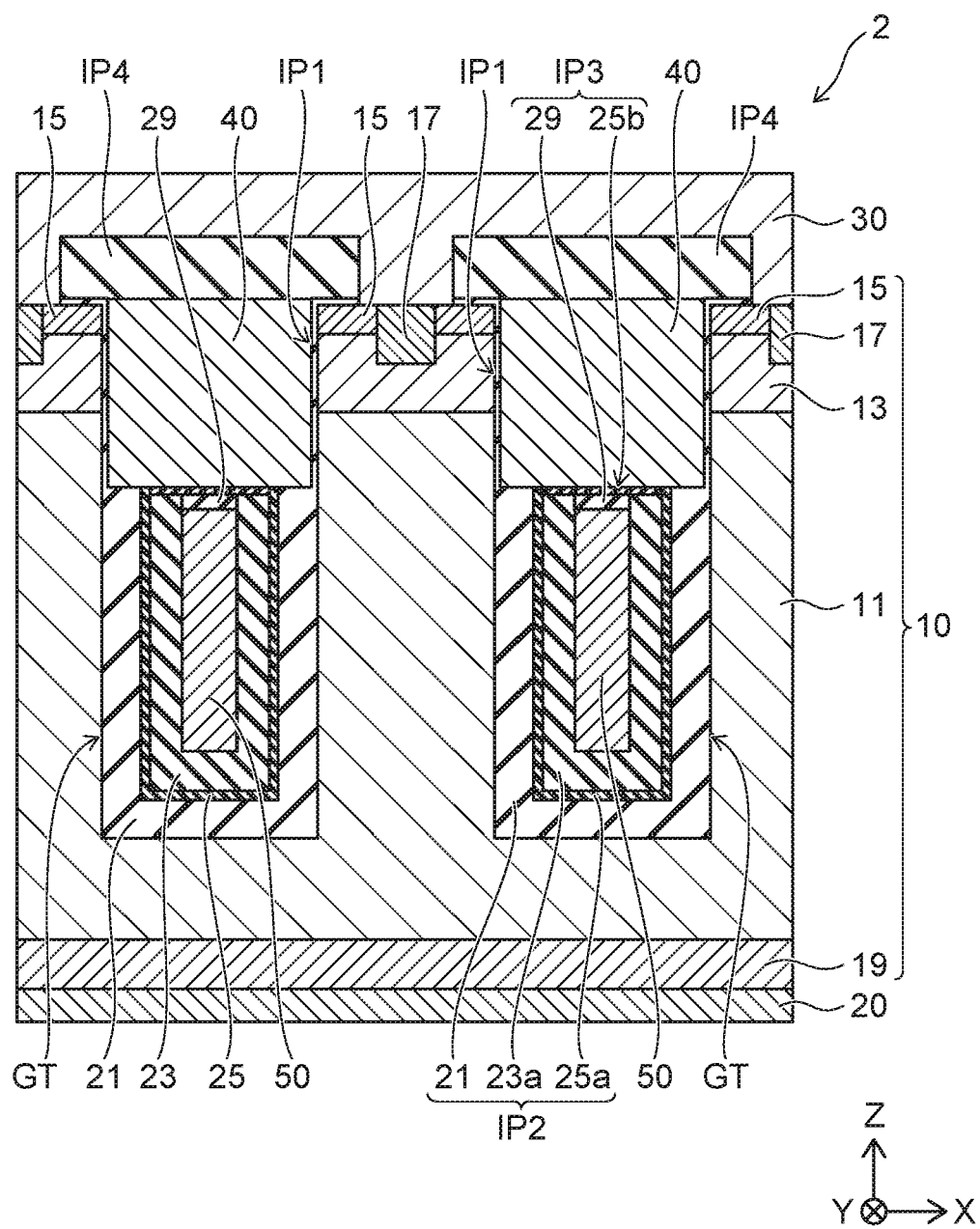
FIG. 10 is a schematic cross-sectional view showing a semiconductor device according to a first modification of the embodiment.

FIG. 10 is a schematic cross-sectional view showing a semiconductor device 2 according to a first modification of the embodiment. The gate electrode 40 of the semiconductor device 2 is positioned between the source electrode 30 and the FP 50. The gate electrode 40 is electrically insulated from the FP 50 by the third insulating part IP3. The gate electrode 40 is electrically insulated from the source electrode 30 by the fourth insulating part IP4.

The third insulating part IP3 is provided between the gate electrode 40 and the FP 50. The third insulating part IP3 includes, for example, an insulating film 29 and the second portion 25b of the insulating film 25. The insulating film 29 is, for example, a silicon oxide film. The insulating film 29 is formed, for example, by thermal oxidation of the FP 50.

Also in the example, the second insulating part IP2 has a stacked structure including the insulating film 21, the insulating film 23, and the first portion 25a of the insulating film 25. The insulating film 25 is provided to surround the insulating film 23 and the FP 50. The insulating film 25 prevents the impurity in the insulating film 23 from moving out to the first insulating part IP1, thereby suppressing the degradation of the switching characteristics in the semiconductor device 2.

Figure 11:
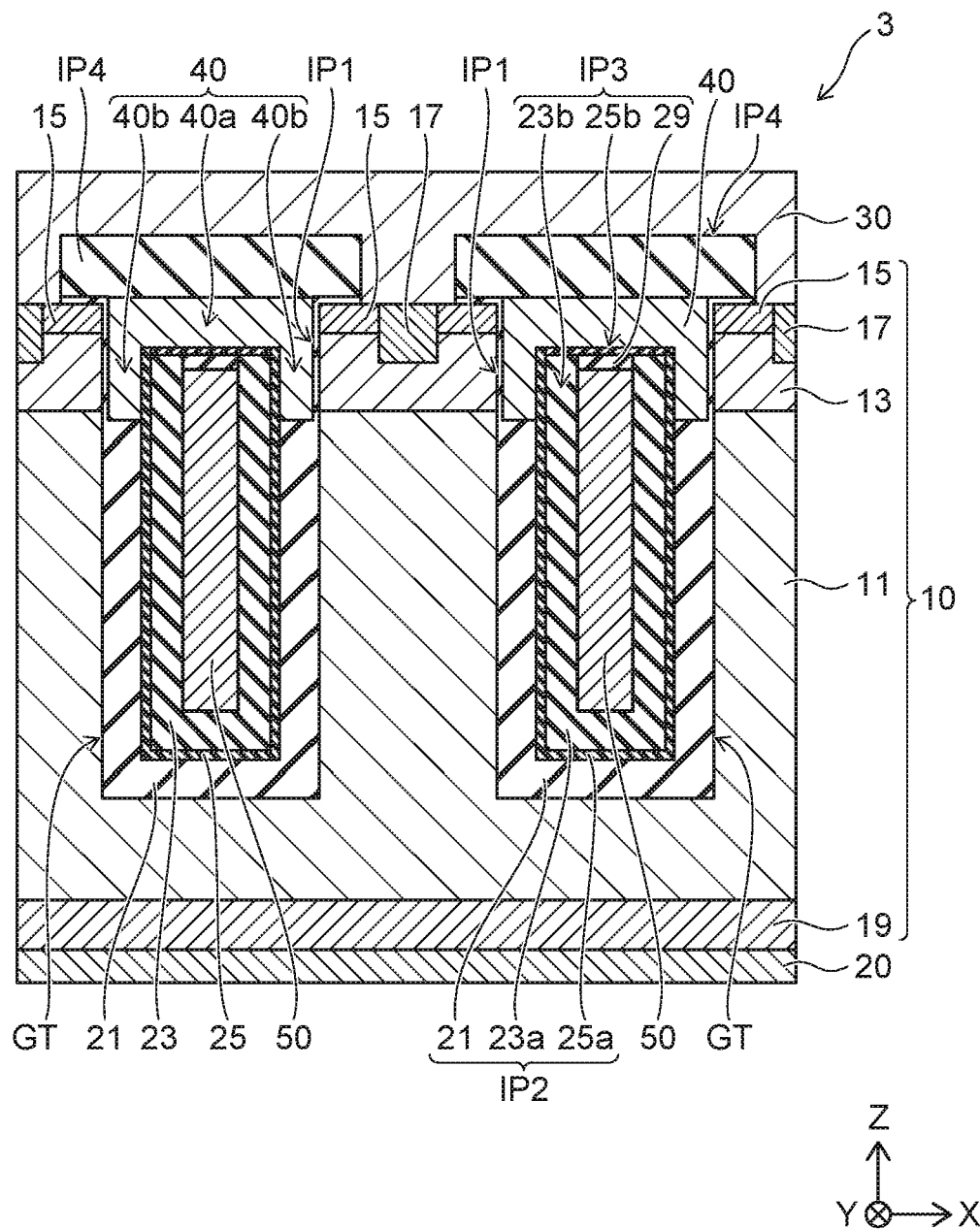
FIG. 11 is a schematic cross-sectional view showing a semiconductor device according to a second modification of the embodiment.

FIG. 11 is a schematic cross-sectional view showing a semiconductor device 3 according to a second modification of the embodiment. In the semiconductor device 3, the gate electrode 40 includes a first portion 40a and a second portion 40b.

As shown in FIG. 11, the upper end of the FP 50 is provided at a higher level in the Z-direction than the lower end of the gate electrode 40. The first portion 40a of the gate electrode 40 is provided between the source electrode 30 and the FP 50. The second portion 40b of the gate electrode 40 is provided between the p-type diffusion layer 13 and the FP 50.

The insulating film 23 includes the first portion 23a and the second portion 23b. The insulating film 25 includes the first portion 25a and the second portion 25b. The insulating film 25 is provided to surround the insulating film 23 and the FP 50.

The first portion 23a of the insulating film 23 is provided between the n-type drift layer 11 and the FP 50, and the second portion 23b is provided between the gate electrode 40 and the FP 50.

The first portion 25a of the insulating film 25 is provided between the n-type drift layer 11 and the FP 50, and the second portion 25b is provided between the gate electrode 40 and the FP 50.

The second insulating part IP2 has a stacked structure including the insulating film 21, the first portion 23a of the insulating film 23, and the first portion 25a of the insulating film 25. The third insulating part IP3 includes the second portion 23b of the insulating film 23, the second portion 25b of the insulating film 25, and the insulating film 29.

Also in the example, the insulating film 25 prevents the impurity in the insulating film 23 from moving out to the first insulating part IP1, thereby suppressing the degradation of the switching characteristics in the semiconductor device 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part;
a first electrode provided on a back surface of the semiconductor part;
a second electrode provided on a front surface of the semiconductor part;
a control electrode provided between the semiconductor part and the second electrode, the semiconductor part having a trench at the front surface side, the control electrode being provided in the trench and electrically insulated from the semiconductor part by a first insulating part;
a third electrode provided inside the trench, the third electrode having a bottom end provided at a bottom of the trench, the third electrode being provided apart from the control electrode, a distance between the third electrode and the first electrode being smaller than a distance between the control electrode and the first electrode, the third electrode being electrically insulated from the semiconductor part by a second insulating part and electrically insulated from the control electrode by a third insulating part;
a first insulating film provided in the second insulating part, the first insulating film being provided between the semiconductor part and the third electrode;
a second insulating film shared by the second insulating part and the third insulating part, the second insulating film being provided between the first insulating film and the third electrode and between the control electrode and the third electrode; and
a third insulating film shared by the second insulating part and the third insulating part, the third insulating film being provided between the first and second insulating films and between the control electrode and the second insulating film, the third insulating film being different in composition from the first insulating film and the second insulating film;
the semiconductor part including a first semiconductor layer of a first conductivity type, a second semiconductor layer of a second conductivity type, and a third semiconductor layer of the first conductivity type,
the first semiconductor layer extending between the first and second electrodes,
the second semiconductor layer being provided between the first semiconductor layer and the second electrode,
the third semiconductor layer being selectively provided between the second semiconductor layer and the second electrode,
the first insulating part being provided between the second semiconductor layer and the control electrode,
the second insulating part being provided between the third electrode and the first semiconductor layer, the second insulating part including the first to third insulating films at the bottom of the trench with the third insulating film being provided between the first and second insulating films at the bottom of the trench, the third insulating film being provided between the bottom end of the third electrode and the first semiconductor layer.

2. The device according to claim 1, wherein
the control electrode is provided between the third electrode and the second semiconductor layer of the semiconductor part,
the third electrode and the control electrode being arranged along an interface between the first semiconductor layer and the second semiconductor layer.

3. The device according to claim 1, wherein
the first insulating film and the second insulating film are silicon oxide films, and
the third insulating film is a silicon nitride film.

4. The device according to claim 1, further comprising a fourth insulating part provided between the second electrode and the control electrode and between the second electrode and the third electrode, wherein the third insulating film extends between the third electrode and the fourth insulating part.

5. The device according to claim 4, further comprising:
a control interconnect provided on the front surface of the semiconductor part with the fourth insulating part interposed, the control interconnect being provided apart from the second electrode, the control interconnect including a contact portion, the contact portion extending into the third insulating film and the fourth insulating part and contacting the control electrode, the control electrode being electrically connected to the control interconnect via the contact portion.

6. The device according to claim 4, wherein
the second electrode includes a contact portion extending into the third insulating film and the fourth insulating part, the contact portion contacting the third electrode, and
the third electrode is electrically connected to the second electrode via the contact portion.

7. The device according to claim 4, wherein
the control electrode is provided between the second electrode and the third electrode.

8. The device according to claim 7, wherein
the third insulating part further includes a fourth insulating film provided between the third electrode and the second portion of the third insulating film.

9. The device according to claim 8, wherein
the fourth insulating film is a silicon oxide film.

10. The device according to claim 4, wherein
the control electrode includes a first portion provided between the second electrode and the third electrode, and a second portion provided between the third electrode and the second semiconductor layer of the semiconductor part.

11. The device according to claim 10, wherein
the second insulating film includes first and second portions, the first portion being provided between the first insulating film and the third electrode, the second portion being provided between the third electrode and the second portion of the control electrode,
the second portion of the third insulating film extends between the second portion of the control electrode and the second portion of the second insulating film, and
the third insulating part further includes the second portion of the second insulating film.

12. The device according to claim 11, wherein
the third insulating part further includes a fourth insulating film provided between the third electrode and the second portion of the third insulating film,
the second portion of the second insulating film is provided between the third electrode and the second portion of the control electrode and between the fourth insulating film and the second portion of the control electrode, and the second portion of the third insulating film is provided between the control electrode and the second portion of the second insulating film and between the control electrode and the fourth insulating film.

13. The device according to claim 12, wherein the fourth insulating film is a silicon oxide film.

* * * * *